(12) United States Patent
Kyung

(10) Patent No.: US 7,285,975 B2
(45) Date of Patent: Oct. 23, 2007

(54) TERMINATION PROVIDING APPARATUS MOUNTED ON MEMORY MODULE OR SOCKET AND MEMORY SYSTEM USING THE APPARATUS

(75) Inventor: Kye-hyun Kyung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 63 days.

(21) Appl. No.: 10/869,410

(22) Filed: Jun. 16, 2004

(65) Prior Publication Data

US 2004/0257109 A1   Dec. 23, 2004

(30) Foreign Application Priority Data

Jun. 19, 2003 (KR) .................. 10-2003-0039900

(51) Int. Cl.
*H03K 17/16* (2006.01)
*H03K 19/003* (2006.01)
*G06F 13/00* (2006.01)
*G06F 13/42* (2006.01)

(52) U.S. Cl. .................. 326/30; 710/100; 710/106; 710/107

(58) Field of Classification Search .................. 326/30; 327/108; 710/106
See application file for complete search history.

(56) References Cited

U.S. PATENT DOCUMENTS

| | | | | |
|---|---|---|---|---|
| 5,224,023 A * | 6/1993 | Smith et al. | .................. | 361/784 |
| 6,128,685 A * | 10/2000 | Cronin | .................. | 710/301 |
| 6,172,895 B1 * | 1/2001 | Brown et al. | .................. | 365/63 |
| 6,219,733 B1 * | 4/2001 | Appel et al. | .................. | 710/301 |
| 6,382,986 B1 * | 5/2002 | Kim et al. | .................. | 439/74 |
| 6,522,165 B2 * | 2/2003 | Ramachandran et al. | ..... | 326/30 |
| 6,530,033 B1 * | 3/2003 | Raynham et al. | .............. | 714/5 |
| 6,545,875 B1 * | 4/2003 | Perino et al. | ............... | 361/760 |
| 6,661,690 B2 * | 12/2003 | Moriarty et al. | .............. | 365/63 |
| 6,717,823 B2 * | 4/2004 | McCall et al. | .............. | 361/785 |
| 6,806,728 B2 * | 10/2004 | Nguyen et al. | ............... | 326/30 |
| 6,828,819 B2 * | 12/2004 | Park et al. | .................... | 326/30 |
| 6,833,618 B2 * | 12/2004 | Ono et al. | .................. | 257/726 |
| 6,963,641 B1 * | 11/2005 | Capon et al. | ............... | 379/398 |
| 7,035,116 B2 * | 4/2006 | Kuzmenka | .................. | 361/789 |
| 7,045,891 B2 * | 5/2006 | Choi | .......................... | 257/723 |
| 2004/0066636 A1 * | 4/2004 | Kollipara et al. | ........... | 361/760 |

FOREIGN PATENT DOCUMENTS

KR   1020010025800   4/2001

* cited by examiner

*Primary Examiner*—Rexford Barnie
*Assistant Examiner*—Dylan White
(74) *Attorney, Agent, or Firm*—Mills & Onello, LLP

(57) ABSTRACT

Provided are an apparatus which provides termination with respect to signals transmitted through a bus line, and a memory system using the apparatus which can prevent the number of sockets from increasing and a continuity module from being used. The termination providing apparatus includes a termination resistor having one end connected to a termination voltage, and is configured in a concave form to be mounted on an upper end of a memory module or in a convex form to be mounted in a socket. The memory system employs the termination providing apparatus, that is, a concave termination cap mounted on an upper end of a memory module, a convex termination cap mounted in a socket, and a top bus extension component mounted on upper ends of two memory modules and forming signal routing between the two memory modules.

5 Claims, 8 Drawing Sheets

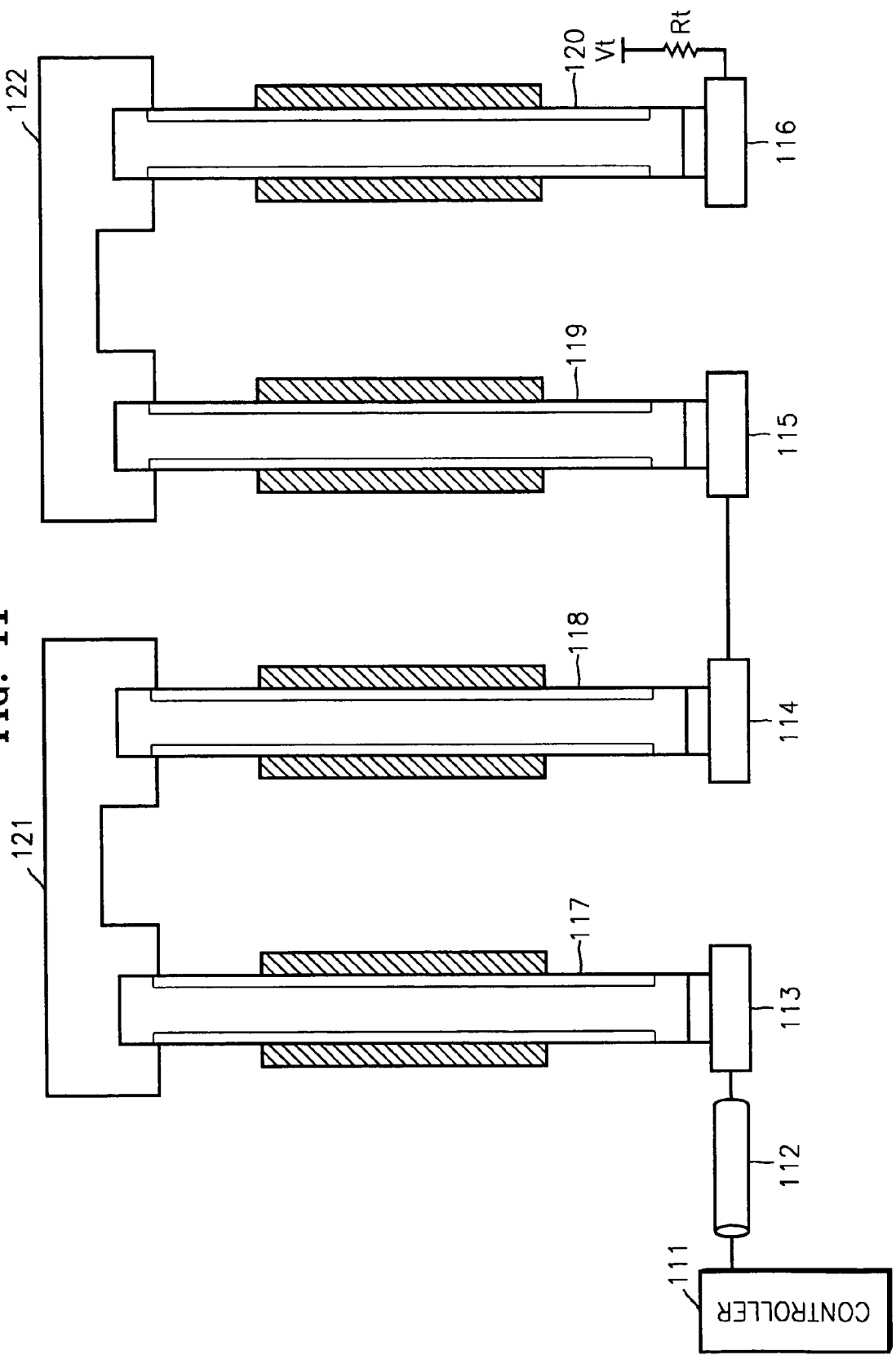

TERMINATION PROVIDING APPARATUS MOUNTED ON MEMORY MODULE OR SOCKET AND MEMORY SYSTEM USING THE APPARATUS

This application claims the priority of Korean Patent Application No. 2003-39900, filed on Jun. 19, 2003, in the Korean Intellectual Property Office, the contents of which are incorporated herein in their entirety by reference.

BACKGROUND OF THE INVENTION

1. Field of the Invention

The present invention relates to a memory system, and more particularly, to a termination providing apparatus mounted on a memory module or a socket and a memory system using the apparatus.

2. Description of the Related Art

As demands for a memory system offering a high speed data rate in excess of 800 Mbps increase, there has been suggested a memory system using short loop through (SLT) technology as shown in FIG. 1, instead of a stub bus technology which has been used but has a speed limitation.

Referring to FIG. 1, in a memory system using SLT technology, data signals are output from a memory controller 11, input to an $i^{th}$ pin of a first memory module 17 through a bus line 12a and a first socket 13, and applied to a specific pin of a dynamic random access memory (DRAM). After being applied to the specific pin of the DRAM, the data signals are output to a bus line 12b on a mother board through a $j^{th}$ pin of the first memory module 17 and the first socket 13. The data signals having passed through the bus line 12b, a second socket 15, and a second memory module 19 in the same way as above are finally terminated at a termination voltage level Vt through a termination resistor Rt.

In the memory system using SLT technology, since twice as many pins as the number of signals should be mounted on a socket and a memory module, the number of pins disadvantageously increases. The increase in the number of pins reduces a pin pitch, thereby raising the cost of the socket. In general, when the pin pitch of the socket is reduced from 1.0 mm to 0.9 mm, the cost of the socket is at least doubled. Further, the increment in the number of pins also increases an insertion force, thereby worsening a module assembly environment.

In addition, as shown in FIG. 2, when only one module 17 is required in a memory system including at least two sockets 13 and 15, all signals are connected through the module. Thus, a continuity module 29 on which no DRAM is mounted is required, thereby raising the cost of the memory system.

SUMMARY OF THE INVENTION

The present invention provides a memory system which can prevent the number of sockets from increasing and a continuity module from being used.

The present invention provides an apparatus which can provide termination with respect to signals transmitted through a bus line in the memory system.

According to an aspect of the present invention, there is provided a memory system comprising: a mother board; a memory controller mounted on the mother board; a socket mounted on the mother board and connected to the memory controller through a bus line; a memory module inserted into the socket; and a concave termination cap mounted on an upper end of the memory module and including a termination resistor.

According to another aspect of the present invention, there is provided a memory system comprising: a mother board; a memory controller mounted on the mother board; a first socket mounted on the mother board and connected to the memory controller through a bus line; a second socket mounted on the mother board and connected to a termination resistor; first and second memory modules inserted into the first socket and the second socket, respectively; and a top bus extension component mounted on upper ends of the first memory module and the second memory module and forming signal routing from the first memory module to the second memory module.

According to a further aspect of the present invention, there is provided a memory system comprising: a mother board; a memory controller mounted on the mother board; a first socket mounted on the mother board and connected to the memory controller through a bus line; second and third sockets mounted on the mother board and connected to each other through a bus line; first and second memory modules inserted into the first socket and the second socket, respectively; a top bus extension component mounted on upper ends of the first memory module and the second memory module and forming signal routing from the first memory module to the second memory module; and a convex termination cap mounted on the third socket and including a termination resistor.

According to still another aspect of the present invention, there is provided a memory system comprising: a mother board; a memory controller mounted on the mother board; a first socket mounted on the mother board and connected to the memory controller through a bus line; second and third sockets mounted on the mother board and connected to each other through a bus line; first, second, and third memory modules inserted into the first socket, the second socket, and the third socket, respectively; a top bus extension component mounted on upper ends of the first memory module and the second memory module and forming signal routing from the first memory module to the second memory module; and a concave termination cap mounted on an upper end of the third memory module and including a termination resistor.

According to yet another aspect of the present invention, there is provided a memory system comprising: a mother board; a memory controller mounted on the mother board; a first socket mounted on the mother board and connected to the memory controller through a bus line; second and third sockets mounted on the mother board and connected to each other through a bus line; a fourth socket mounted on the mother board and connected to a termination resistor; first, second, third, and fourth memory modules inserted into the first socket, the second socket, the third socket, and the fourth socket, respectively; a first top bus extension component mounted on upper ends of the first memory module and the second memory module and forming signal routing from the first memory module to the second memory module; and a second top bus extension component mounted on upper ends of the third memory module and the fourth memory module and forming signal routing from the third memory module to the fourth memory module.

According to an aspect of the present invention, there is provided an apparatus providing termination with respect to signals transmitted through a bus line in a memory system including a memory module inserted into a socket, the apparatus comprising: a termination resistor, one end of which is connected to a terminal voltage, wherein the apparatus is configured in a concave form so as to be mounted on an upper end of the memory module, and the other end of the termination resistor is connected to the bus line.

According to another aspect of the present invention, there is provided an apparatus providing termination with respect to signals transmitted through a bus line in a memory system including a plurality of sockets, the apparatus comprising: a termination resistor, one end of which is connected to a termination voltage, wherein the apparatus is configured in a convex form so as to be mounted on one of the plurality of sockets, and the other end of the termination resistor is connected to the bus line.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 11 is a diagram of a memory system according to a sixth preferred embodiment of the present invention.

DETAILED DESCRIPTION OF THE INVENTION

Figure 3:
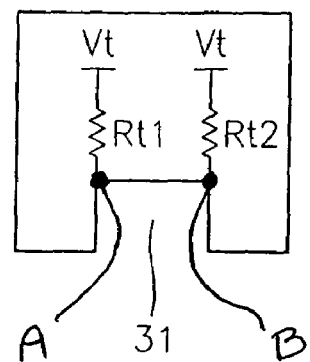
FIG. 3 is a diagram of a concave termination cap acting as an apparatus which provides termination according to a first preferred embodiment of the present invention.

FIG. 3 is a schematic diagram of a concave termination cap acting as an apparatus which provides termination according to a first preferred embodiment of the present invention. The schematic diagram of FIG. 3 illustrates electrical connections of the termination cap and also schematically illustrates the physical configuration of the termination cap.

Referring to FIG. 3, the termination providing apparatus includes two termination resistors Rt1 and Rt2 each having one end connected to a termination voltage Vt, and is configured in a concave form, concave form meaning having an inward opening 31, so as to be mounted on an upper end of a memory module. Elements A and B represent the edges of the termination enclosure and the wiring of the resistors Rt1 and Rt2.

When the termination providing apparatus is mounted on the upper end of a memory module, the termination resistors Rt1 and Rt2 are connected to a bus line of the memory module, namely, a bus line of a memory system in which the memory module is mounted. Thus, termination with respect to signals transmitted through the bus line can be provided by mounting the termination providing apparatus on the upper end of the memory module in the memory system.

Figure 4:
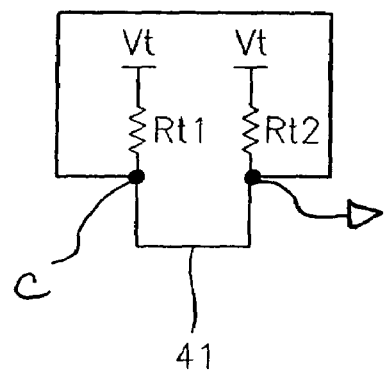
FIG. 4 is a diagram of a convex termination cap acting as an apparatus which provides termination according to a second preferred embodiment of the present invention.

FIG. 4 is a schematic diagram of a convex termination cap acting as an apparatus which provides termination according to a second preferred embodiment of the present invention. The schematic diagram of FIG. 4 illustrates electrical connections of the termination cap and also schematically illustrates the physical configuration of the termination cap.

Referring to FIG. 4, the termination providing apparatus includes two termination resistors Rt1 and Rt2 each having one end connected to a termination voltage Vt, and is configured in a convex form, convex form meaning having a protrusion 41, so as to be mountable in a socket. Elements C and D represent the edges of the termination enclosure and the wiring of the resistors Rt1 and Rt2.

When the termination providing apparatus is mounted in the socket, the termination resistors Rt1 and Rt2 are connected to a bus line connected to the socket, namely, a bus line of a memory system. Thus, termination with respect to signals transmitted through the bus line can be easily provided by mounting the termination providing apparatus in the socket.

Figure 5:
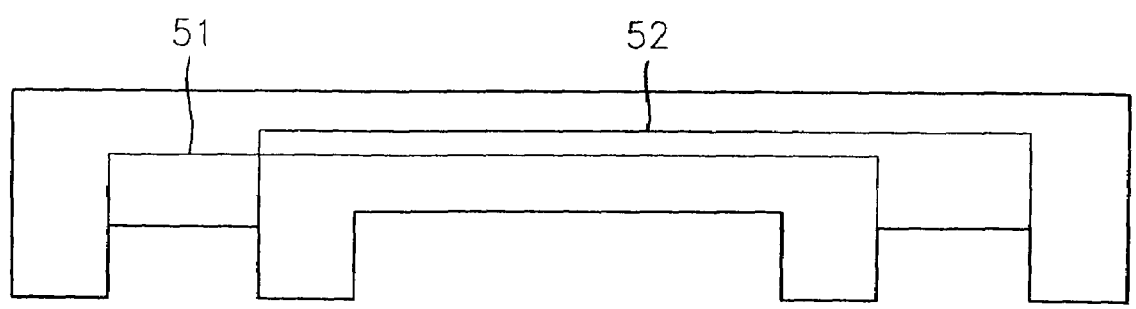
FIG. 5 is a diagram of a top bus extension component according to a preferred embodiment of the present invention.

FIG. 5 is a diagram of a top bus extension component according to a preferred embodiment of the present invention.

The top bus extension component serves to form signal routings 51 and 52 from a first memory module to a second memory module adjacent to the first memory module. The top bus extension component is configured to be mounted on upper ends of the first memory module and the second memory module.

Memory systems using the concave termination cap, the convex termination cap, and the top bus extension component according to the present invention will be described below.

Figure 6:
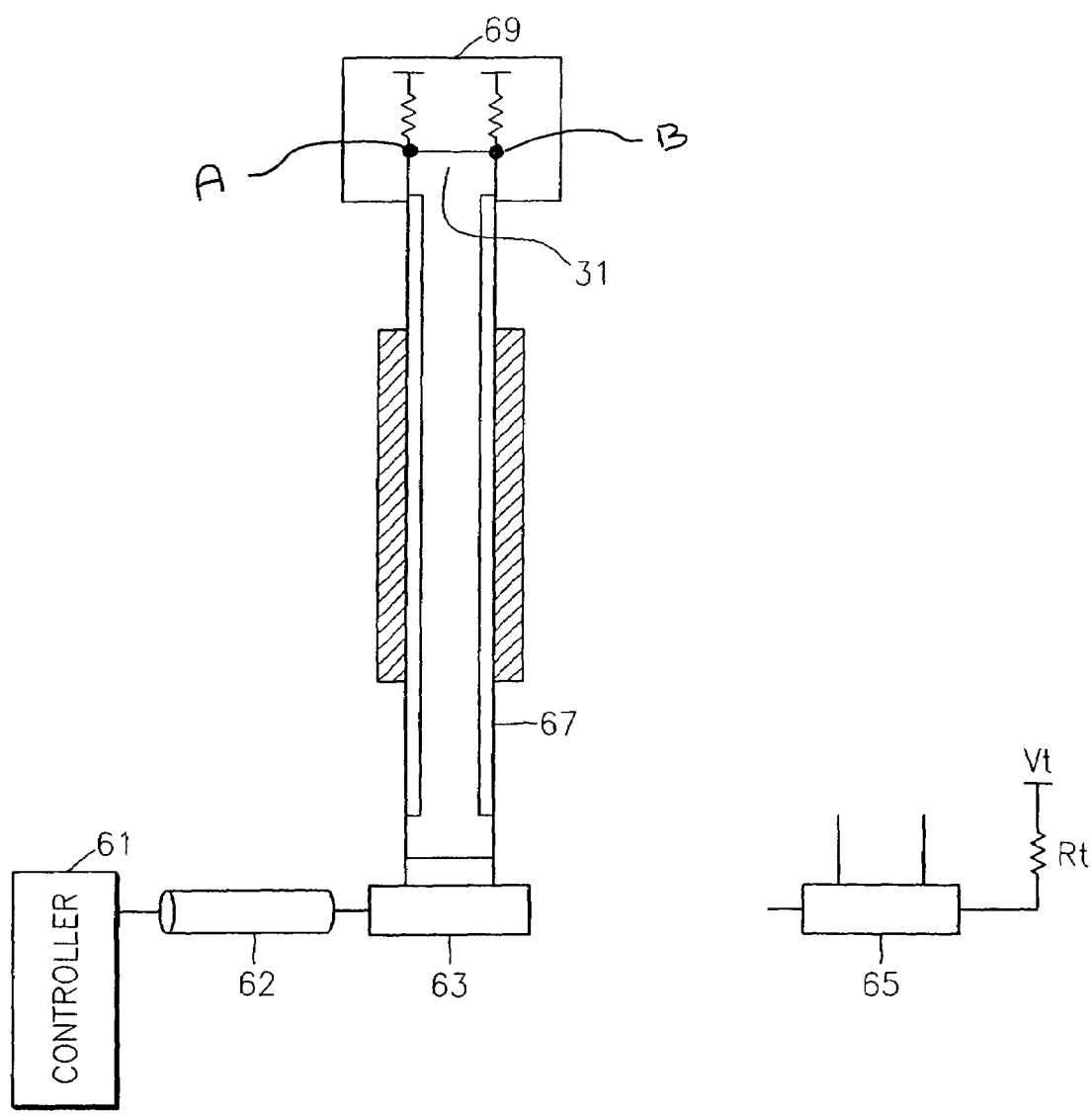
FIG. 6 is a diagram of a memory system according to a first preferred embodiment of the present invention.
Figure 7:
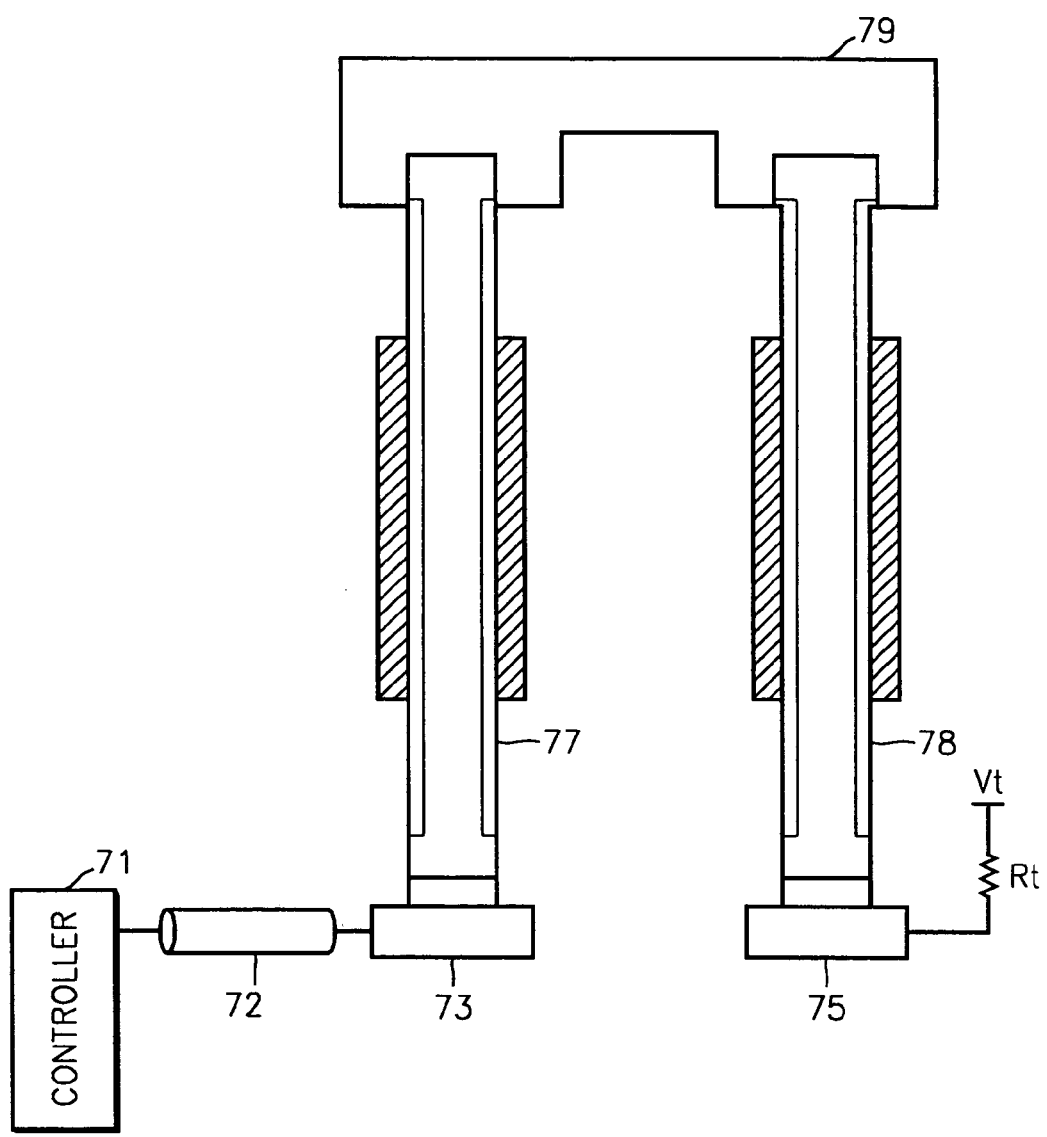
FIG. 7 is a diagram of a memory system according to a second preferred embodiment of the present invention.

FIG. 6 is a schematic diagram of a memory system according to a first preferred embodiment of the present invention, and FIG. 7 is a diagram of a memory system according to a second preferred embodiment of the present invention. The schematic diagram of FIG. 6 illustrates electrical connections of the termination cap and also schematically illustrates the physical configuration of the termination cap.

Two modules can be mounted in the memory systems according to the first and second preferred embodiments. The first preferred embodiment of FIG. 6 shows that only one module is mounted and the second preferred embodiment of FIG. 7 shows that two modules are mounted.

Referring to FIG. 6, the memory system includes a mother board (not shown), a memory controller 61 mounted on the mother board, and first and second sockets 63 and 65 mounted on the mother board. The first socket 63 is connected to the memory controller 61 through a bus line 62, and the second socket 65 is connected to a termination voltage Vt through a termination resistor Rt.

A memory module 67 is inserted only into the first socket 63 and a concave termination cap 69 including such termination resistors Rt1 and Rt2 and having inward opening 31 as shown in FIG. 3 is mounted on an upper end of the memory module 67.

Accordingly, the bus line 62 connected to a lower part of the memory module 67 through the first socket 63 is connected to a pin of a dynamic random access memory (DRAM) on the memory module 67 and then is connected to an upper part of the memory module 67. Further, the bus line 62 connected to the upper part of the memory module 67 is connected to the termination resistors Rt1 and Rt2 within the concave termination cap 69.

Therefore, when only one module 67 is used, termination is provided by the concave termination cap 69 mounted on the upper end of the memory module 67, thereby eliminating the necessity for a continuity module.

Referring to FIG. 7, the memory system includes a mother board (not shown), a memory controller 71 mounted on the mother board, and first and second sockets 73 and 75 mounted on the mother board. The first socket 73 is connected to the memory controller 71 through a bus line 72, and the second socket 75 is connected to a termination voltage Vt through a termination resistor Rt.

A first memory module 77 and a second memory module 78 are inserted in the first socket 73 and the second socket 75, respectively, and a top bus extension component 79 as shown in FIG. 5 is mounted on the upper ends of the first memory module 77 and the second memory module 78. Signal routing from the first memory module 77 to the second memory module 78 is achieved by the top bus extension component 79.

Accordingly, signals transmitted to the bus line 72 on the mother board through the second socket 75 after passing through the second memory module 78 are terminated through the termination resistor Rt on the mother board.

Figure 1:
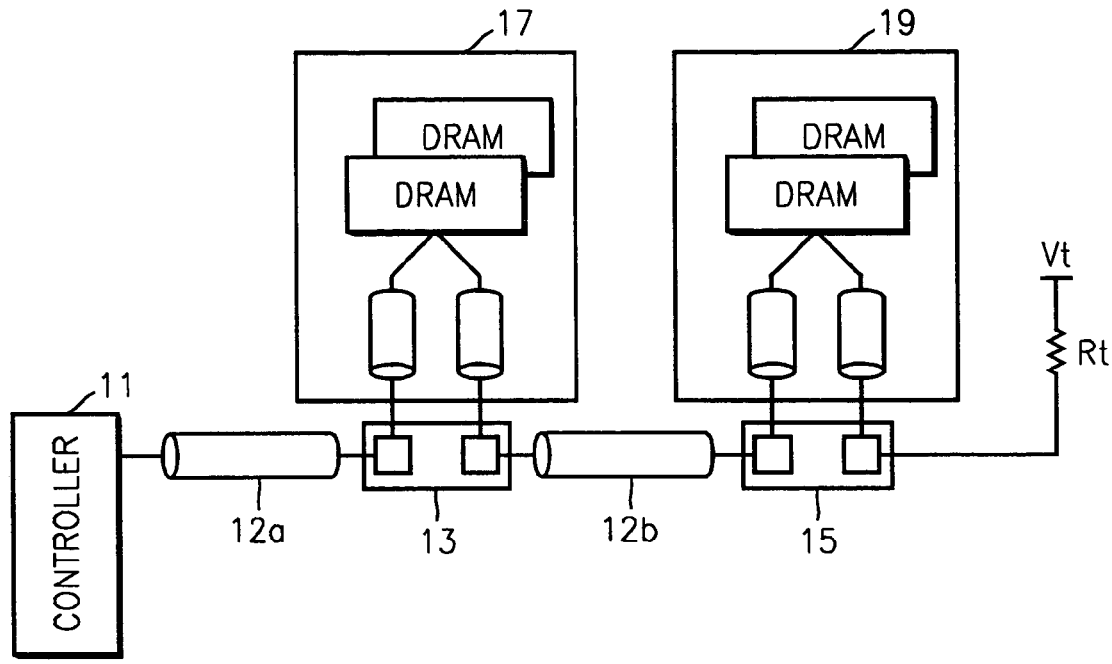
FIG. 1 is a block diagram of a memory system using a conventional short loop through (SLT) technology.
Figure 2:
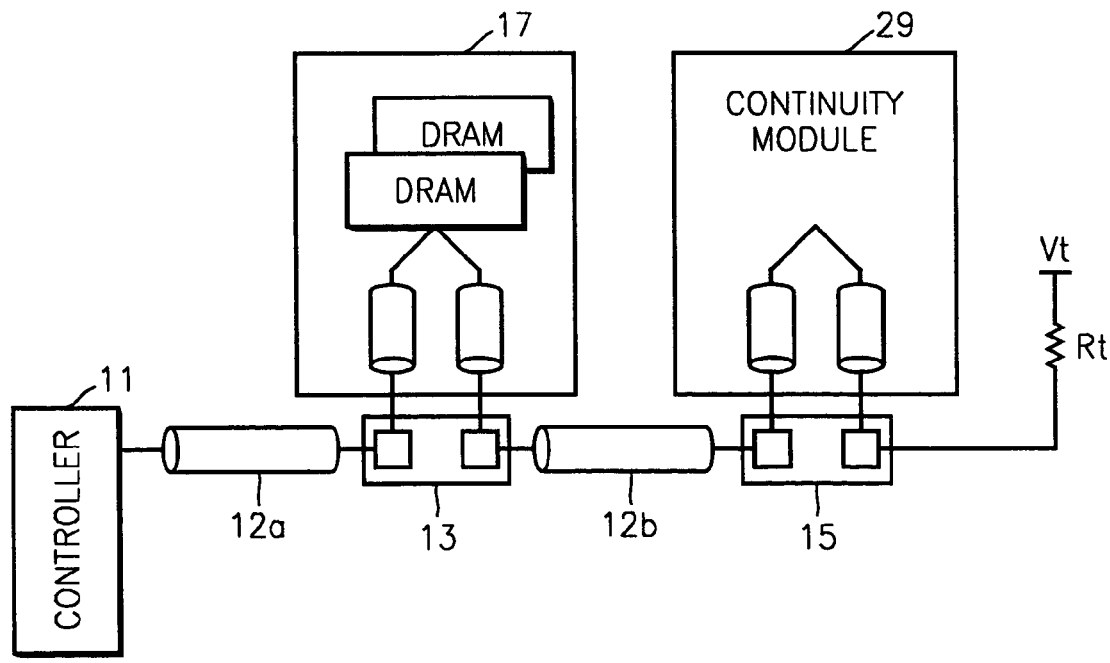
FIG. 2 is a block diagram illustrating a continuity module used in the memory system using the conventional SLT technology.

Since signals input to lower or upper parts of the memory modules are output through upper or lower parts of the memory modules, respectively, the total number of pins is equal to that in the conventional art described in FIG. 1. However, the number of pins at one of the upper and lower parts of each of the memory modules is reduced to a half, and thus, the pin pitch of sockets is double that of the conventional art described in FIG. 1. As a consequence, the number of pins decreases, thereby reducing the cost of the sockets.

Figure 8:
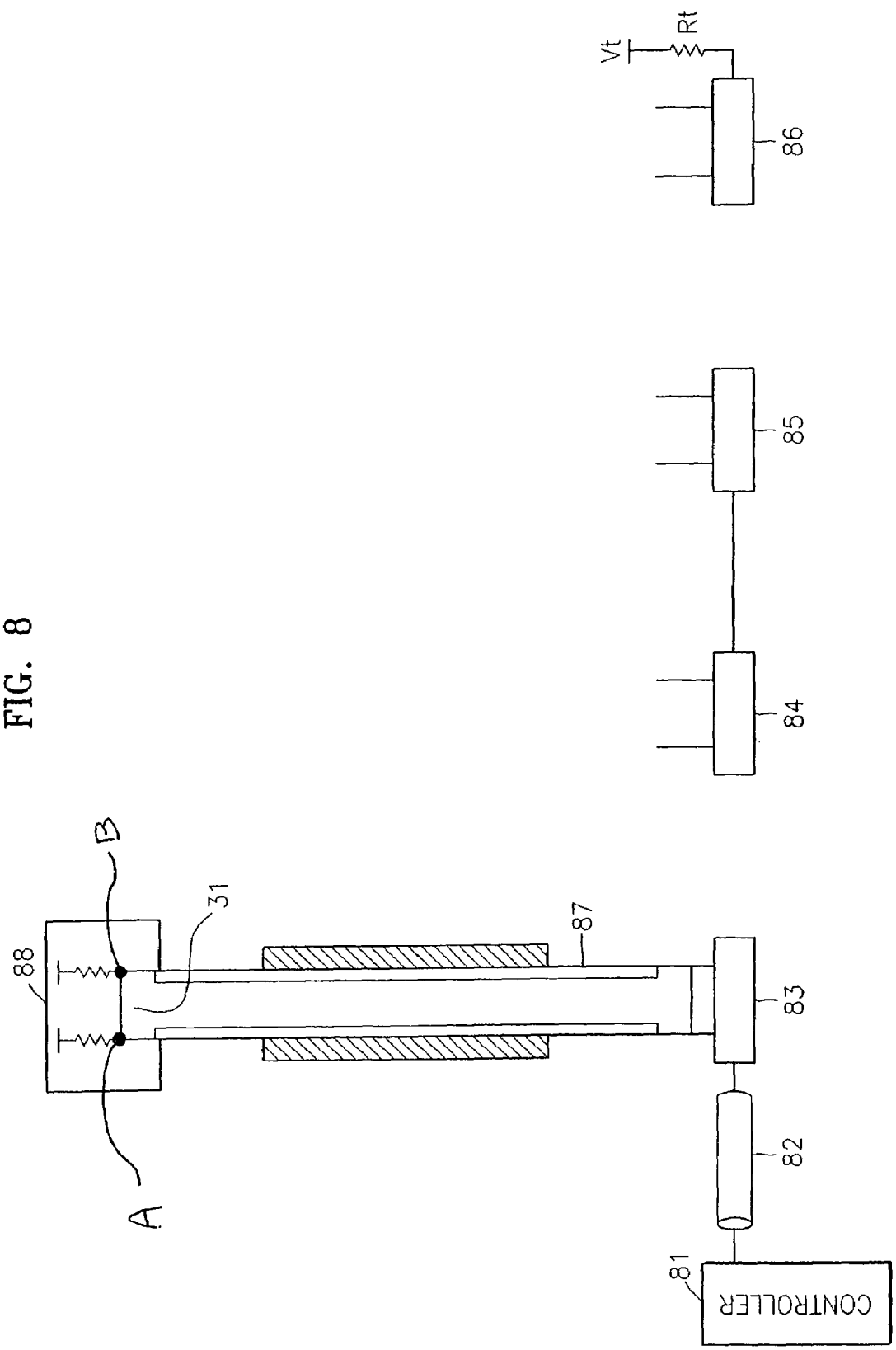
FIG. 8 is a diagram of a memory system according to a third preferred embodiment of the present invention.
Figure 9:
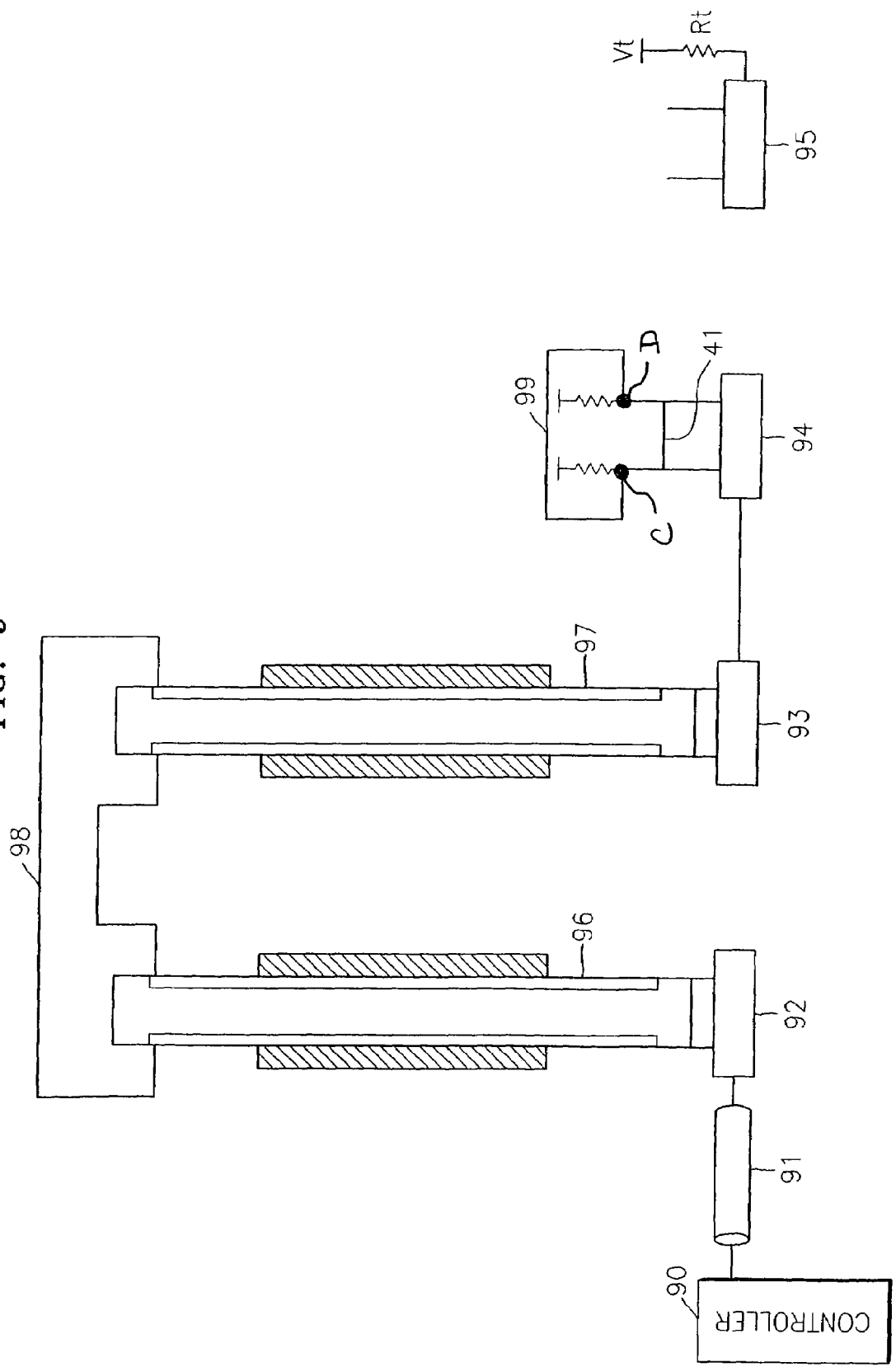
FIG. 9 is a diagram of a memory system according to a fourth preferred embodiment of the present invention.
Figure 10:
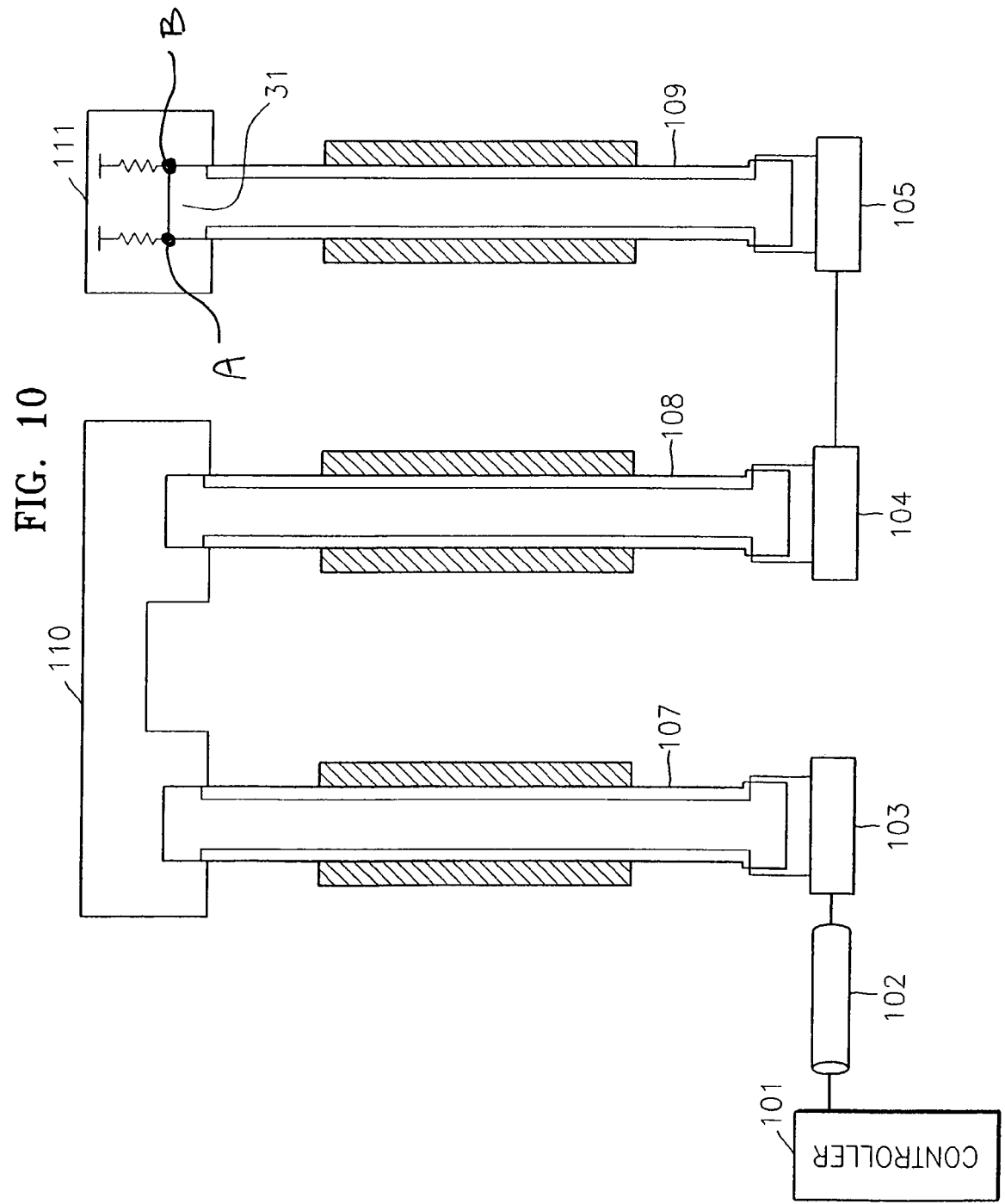
FIG. 10 is a diagram of a memory system according to a fifth preferred embodiment of the present invention.

FIG. 8 is a schematic diagram of a memory system according to a third preferred embodiment of the present invention, and FIG. 9 is a schematic diagram of a memory system according to a fourth preferred embodiment of the present invention. FIG. 10 is a schematic diagram of a memory system according to a fifth preferred embodiment of the present invention, and FIG. 11 is a schematic diagram of a memory system according to a sixth preferred embodiment of the present invention. The schematic diagrams of FIGS. 8, 9 and 10 illustrate electrical connections of the termination caps and also schematically illustrate the physical configurations of the termination caps.

Four modules can be mounted on the memory systems according to the third through sixth preferred embodiments of the present invention. The third preferred embodiment of FIG. 8 shows that only one module is mounted, and the fourth preferred embodiment of FIG. 9 shows that two modules are mounted. The fifth preferred embodiment of FIG. 10 shows that three modules are mounted, and the sixth preferred embodiment of FIG. 11 shows that four modules are mounted.

Referring to FIG. 8, the memory system according to the third preferred embodiment includes a mother board (not shown), a memory controller 81 mounted on the mother board, and first through fourth sockets 83 through 86 mounted on the mother board. The first socket 83 is connected to the memory controller 81 through a bus line 82, and the fourth socket 86 is connected to a termination voltage Vt through a termination resistor Rt. The second socket 84 and the third socket 85 are connected to each other.

In particular, a memory module 87 is inserted only into the first socket 83, and a concave termination cap 88 including termination resistors Rt1 and Rt2 and having inward opening 31 as shown in FIG. 3 is mounted on an upper end of the memory module 87. Accordingly, the bus line 82 connected to the memory module 87 through the first socket 83 is connected to the termination resistors Rt1 and Rt2 within the concave termination cap 88. Thus, termination is provided by the concave termination cap 88 mounted on the upper end of the memory module 87.

Referring to FIG. 9, the memory system according to the fourth preferred embodiment includes a mother board (not shown), a memory controller 90 mounted on the mother board, and first through fourth sockets 92 through 95 mounted on the mother board. The first socket 92 is connected to the memory controller 90 through a bus line 91, and the fourth socket 95 is connected to a termination voltage Vt through a termination resistor Rt. The second socket 93 and the third socket 94 are connected to each other.

In particular, a first memory module 96 and a second memory module 97 are inserted only into the first socket 92 and the second socket 93, respectively. A top bus extension component 98 as shown in FIG. 5 is mounted on upper ends of the two memory modules 96 and 97. Signal routing from the first memory module 96 to the second memory module 97 is achieved by the top bus extension component 98. A convex termination cap 99 including termination resistors Rt1 and Rt2 and having protrusion 41 as shown in FIG. 4 is mounted in the third socket 94.

Accordingly, signals transmitted through the second socket 93 and the third socket 94 after passing through the second memory module 97 are terminated by the convex termination cap 99.

Referring to FIG. 10, the memory system according to the fifth preferred embodiment includes a mother board (not shown), a memory controller 101 mounted on the mother board, and first through fourth sockets 103 through 106 mounted on the mother board. The first socket 103 is connected to the memory controller 101 through a bus line 102, and the fourth socket 106 is connected to a termination voltage Vt through a termination resistor Rt. The second socket 104 and the third socket 105 are connected to each other.

A first memory module 107, a second memory module 108, and a third memory module 109 are inserted into the first socket 103, the second socket 104, and the third socket 105, respectively. A top bus extension component 110 is mounted on upper ends of the first and second memory modules 107 and 108. A concave termination cap 111 including termination resistors Rt1 and Rt2 and having protrusion 41 is mounted on an upper end of the third memory module 109. Thus, termination is provided by the concave termination cap 111 mounted on the upper end of the third memory module 109.

Referring to FIG. 11, the memory system includes a mother board (not shown), a memory controller 111 mounted on the mother board, and first through fourth sockets 113 through 116 mounted on the mother board. The first socket 113 is connected to the memory controller 111 through a bus line 112, and the fourth socket 116 is connected to a termination voltage Vt through a termination resistor Rt. The second socket 114 and the third socket 115 are connected to each other.

A first memory module 117, a second memory module 118, a third memory module 119, and a fourth memory module 120 are inserted into the first socket 113, the second socket 114, the third socket 115, and the fourth socket 116, respectively. A first top bus extension component 121 is mounted on upper ends of the first and second memory modules 117 and 118, and a second top bus extension component 122 is mounted on upper ends of the third and fourth memory modules 119 and 120. Accordingly, signal routing from the first memory module 117 to the second memory module 118 is achieved by the first top bus extension component 121, and signal routing from the third memory module 119 to the fourth memory module 120 is achieved by the second top bus extension component 122.

Signals transmitted to the bus line on the mother board through the fourth socket 116 after passing through the final memory module 120 are terminated through the termination resistor Rt on the mother board.

As described above, the termination providing apparatus is mounted on the upper end of the memory module or in the socket, and accordingly, can easily provide termination with respect to signals transmitted through the bus line. Furthermore, a memory system using a termination providing apparatus according to the present invention can prevent the number of socket pins from increasing and a continuity module from being used, which are problems of a short loop through (SLT) technology.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus providing termination with respect to signals transmitted through a bus line in a memory system including a memory module inserted into a socket, the apparatus comprising:
   a termination resistor, one end of which is connected to a terminal voltage,
   wherein:
      the apparatus is configured in a form in which the apparatus comprises an inward opening such that the apparatus is mounted on an upper end of the memory module, and
      the other end of the termination resistor is connected to the bus line.

2. An apparatus providing termination with respect to signals transmitted through a bus line in a memory system including a plurality of sockets, the apparatus comprising:
   first and second termination resistors,
   wherein:
      the apparatus is configured in a form in which the apparatus comprises a single protrusion extending from the apparatus that comprises both the first and second termination resistors such that the apparatus can be mounted in one of the plurality of sockets, one end of the first and second termination resistors being configured such that it is connected to a termination voltage both when the apparatus is not mounted in one of the plurality of sockets and when the apparatus is mounted in one of the plurality of sockets, and
      the other end of each of first and second termination resistors is configured such that it is connectable to the bus line when the apparatus is not mounted in one of the plurality of sockets and is connected to bus line when the apparatus is mounted in one of the plurality of sockets.

3. A memory system comprising:
   a mother board;
   a memory controller mounted on the mother board;
   a socket mounted on the mother board and connected to the memory controller through a bus line;
   a memory module inserted into the socket; and
   a termination cap including a termination resistor, the termination cap comprising an inward opening such that the termination cap can be mounted on an upper end of the memory module.

4. A memory system comprising:
   a mother board;
   a memory controller mounted on the mother board;
   a first socket mounted on the mother board and connected to the memory controller through a bus line;
   second and third sockets mounted on the mother board and connected to each other through a bus line;
   first and second memory modules inserted into the first socket and the second socket, respectively;
   a top bus extension component mounted on upper ends of the first memory module and the second memory module and forming signal routing from the first memory module to the second memory module; and
   a termination cap mounted on the third socket and including a termination resistor and a protrusion extending from the termination cap such that the termination cap can be mounted on the third socket.

5. A memory system comprising:
   a mother board;
   a memory controller mounted on the mother board;
   a first socket mounted on the mother board and connected to the memory controller through a bus line;
   second and third sockets mounted on the mother board and connected to each other through a bus line;
   first, second, and third memory modules inserted into the first socket, the second socket, and the third socket, respectively;
   a top bus extension component mounted on upper ends of the first memory module and the second memory module and forming signal routing from the first memory module to the second memory module; and
   a termination cap mounted on an upper end of the third memory module and including a termination resistor an inward opening in the termination cap such that the termination cap can be mounted on the upper end of the thrid memory module.

* * * * *

UNITED STATES PATENT AND TRADEMARK OFFICE
CERTIFICATE OF CORRECTION

| | | |
|---|---|---|
| PATENT NO. | : 7,285,975 B2 | Page 1 of 1 |
| APPLICATION NO. | : 10/869410 | |
| DATED | : October 23, 2007 | |
| INVENTOR(S) | : Kye-hyun Kyung | |

It is certified that error appears in the above-identified patent and that said Letters Patent is hereby corrected as shown below:

Cover page, Item (56) Reference Cited, U.S. Patent Documents, insert --6,963,941 B2* 11/2005 Lee ….. 710/107--

Column 3, line 67 delete "mounted" and insert --mountable--

Column 8, line 10 insert --the-- before "bus"

Column 8, line 58 delete "thrid" and insert --third--

Signed and Sealed this

Sixteenth Day of December, 2008

JON W. DUDAS
*Director of the United States Patent and Trademark Office*